(12) United States Patent
Chou

(10) Patent No.: US 8,916,814 B2
(45) Date of Patent: Dec. 23, 2014

(54) MULTI-DIRECTIONAL ROLLING MEMBER SENSOR SWITCH

(76) Inventor: Tien-Ming Chou, Taichung (TW)

( * ) Notice: Subject to any disclaimer, the term of this patent is extended or adjusted under 35 U.S.C. 154(b) by 260 days.

(21) Appl. No.: 13/562,933

(22) Filed: Jul. 31, 2012

(65) Prior Publication Data

US 2014/0034814 A1 Feb. 6, 2014

(51) Int. Cl.
*H01J 40/14* (2006.01)
*G01J 1/36* (2006.01)

(52) U.S. Cl.
USPC ..................................... 250/239; 250/227.22

(58) Field of Classification Search
CPC . H03K 17/78; H03K 17/9631; H03K 17/965; H03K 3/42
USPC ........ 250/214 SW, 221, 227.22, 239, 559.12; 200/61.02, 61.11, 61.46, 61.52
See application file for complete search history.

(56) References Cited

U.S. PATENT DOCUMENTS 5,373,153 A * 12/1994 Cumberledge et al. .... 250/231.1

* cited by examiner

*Primary Examiner* — Georgia Y Epps
*Assistant Examiner* — Don Williams
(74) *Attorney, Agent, or Firm* — McNees Wallace & Nurick LLC

(57) ABSTRACT

A sensor switch includes a housing having a receiving chamber defined by top and bottom walls and a multi-sided chamber surrounding wall, and a light emitter and a light receiver disposed outwardly of the surrounding wall at two opposite positions. The surrounding wall is formed with two light passage holes which are aligned respectively with the light emitter and the light receiver to permit a light path to extend therethrough. The bottom wall has a bottom inclined wall face that forms an included angle of from −80 degrees to 80 degrees with respect to a first axis. A rolling member is movable in the receiving chamber to alternately block and unblock the light path when moving to and fro on the bottom wall.

7 Claims, 14 Drawing Sheets

MULTI-DIRECTIONAL ROLLING MEMBER SENSOR SWITCH

FIELD OF THE INVENTION

The invention relates to a sensor switch, more particularly to a multi-directional sensor switch that can generate ON/OFF signal by changing its angular position.

DESCRIPTION OF THE RELATED ART

Referring to FIG. 1, a conventional sensor switch 1 is shown to include a base seat 11 and a cover 12 coupled to each other, a light emitter 13 and a light receiver 14 oppositely mounted in the base seat 11, and a ball member 15. The base seat 11 has a conical face 111 surrounding an axial line (X) and defining a receiving chamber 110, and two notches 112 formed through the conical face 111 to communicate with the receiving chamber 110 and facing respectively the light emitter 13 and the light receiver 14. Light from the light emitter 13 emits toward the light receiver 14 through the notches 112. The ball member 15 is received in the receiving chamber 110.

When the sensor switch 1 is mounted upright, as shown in FIG. 1, a light path between the light emitter 13 and the light receiver 14 is blocked by the ball member 15, thereby opening the circuit and placing the sensor switch in an "OFF" state. When the sensor switch 1 is tilted to any angle exceeding a predetermined angle, the ball member 15 is moved away from blocking the light path, thereby closing the circuit and shifting the sensor switch to an "ON" position.

Referring to FIG. 2, in combination with FIG. 1, an iron 2 is exemplified to incorporate the aforesaid sensor switch 1. The sensor switch 1 is mounted on a machine plate 21 of the iron 2. As shown in state (a) of FIG. 2, when the iron 2 is in a normal use position, the machine plate 21 is in an upright position, while the sensor switch 1 is transverse to the machine plate 21. At this time, the ball member 15 is disposed in an unblocking position that unblocks the light path, and the sensor switch 1 can generate an ON signal which is used as a basis for heating up the iron 2. As shown in state (b) of FIG. 2, when the iron 2 is tilted upright, the machine plate 21 is in a horizontal position, while the sensor switch 1 is in the upright position. At this time, the ball member 15 is disposed in a blocking position that blocks the light path, and the sensor switch 1 can generate an OFF signal which is used as a basis for cutting off electricity input at a predetermined time and stop heating up the iron 2.

However, many users usually place the iron 2 in a leftward or rightward position, as shown in state (c) of FIG. 2, when they have stopped ironing of the clothes. At this state, the ball member 15 is still disposed in the unblocking position, so that heat is continuously built up within the iron 2 which can pose a great danger. Hence, use of the conventional sensor switch 1 is limited.

SUMMARY OF THE INVENTION

Therefore, an object of the present invention is to provide a multi-directional sensor switch that can produce different functions at different angular positions.

According to this invention, a sensor switch comprises a housing, a rolling member and an optoelectronic device. The housing includes a receiving chamber which is defined by a top wall, a bottom wall and a multi-sided chamber surrounding wall formed between said top and bottom walls. The rolling member is disposed rollably in the receiving chamber. The optoelectronic device is mounted in the housing, and has a light emitter and a light receiver disposed outwardly of the chamber surrounding wall at two opposite positions. The chamber surrounding wall is formed with two light passage holes which are aligned respectively with the light emitter and the light receiver to permit a light path from the light emitter to the light receiver to extend therethrough. The rolling member is movable in the receiving chamber between a blocking position to block the light path and an unblocking position to unblock the light path. The bottom wall has a bottom inclined wall face that is inclined with respect to a plane extending substantially parallel to and below the light path from the light emitter to the light receiver and that forms an included angle of from −80 degrees to 80 degrees with respect to a first axis lying in the plane. The rolling member alternately blocks and unblocks the light path when moving to and fro on the bottom wall.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
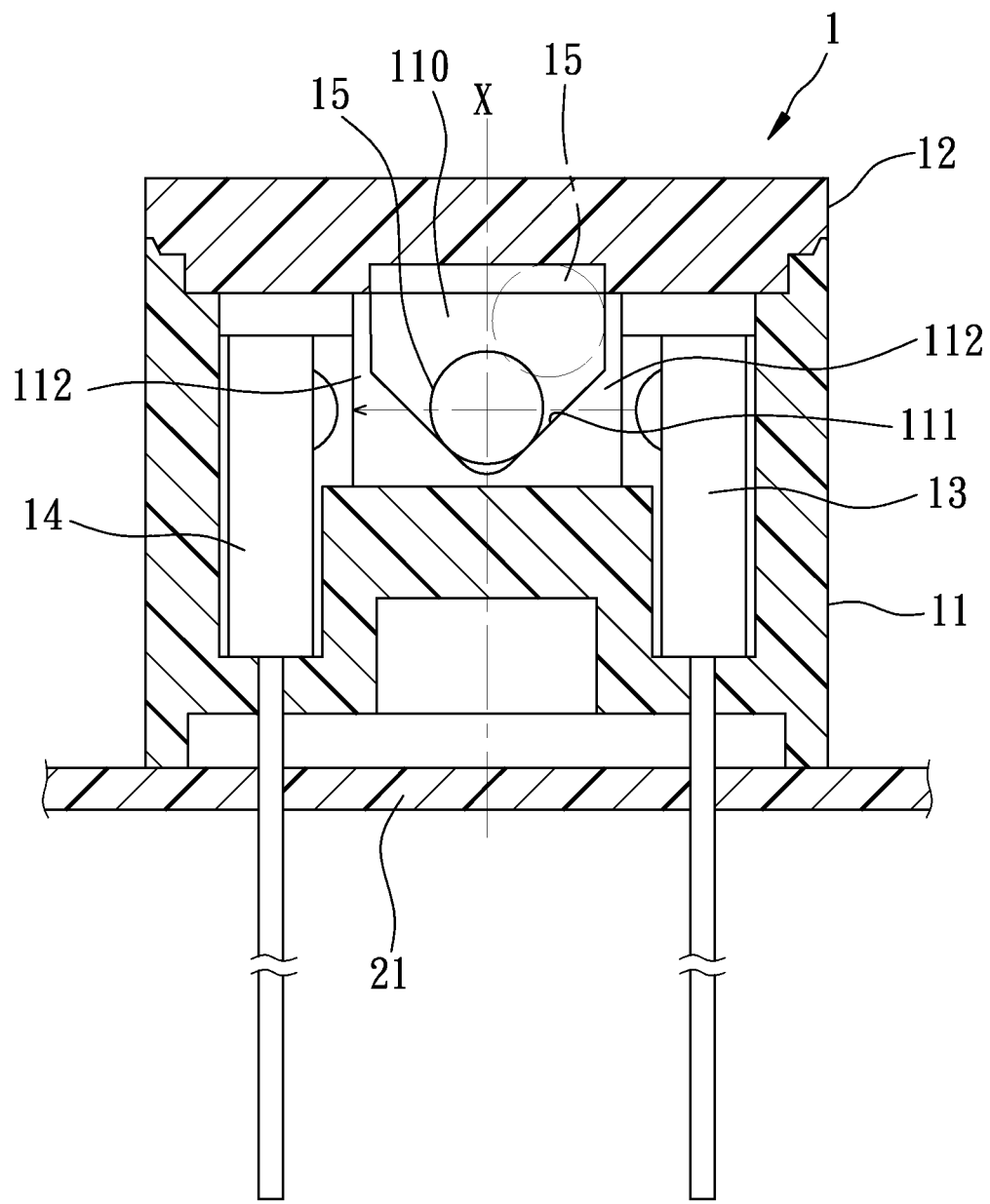
FIG. 1 is a sectional view of a conventional sensor switch.
Figure 2:
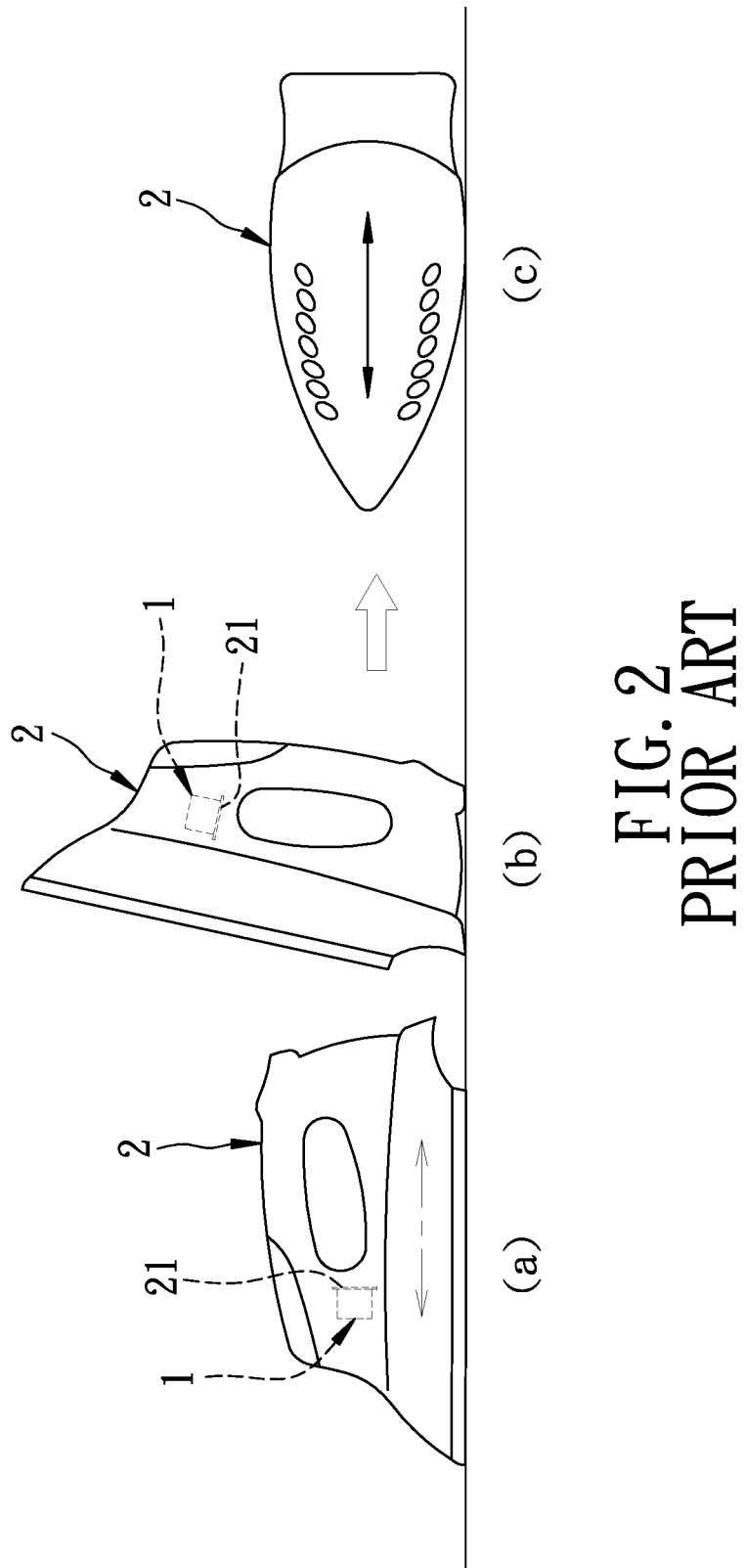
FIG. 2 illustrates an iron incorporating the conventional sensor switch and disposed in different positions.
Figure 3:
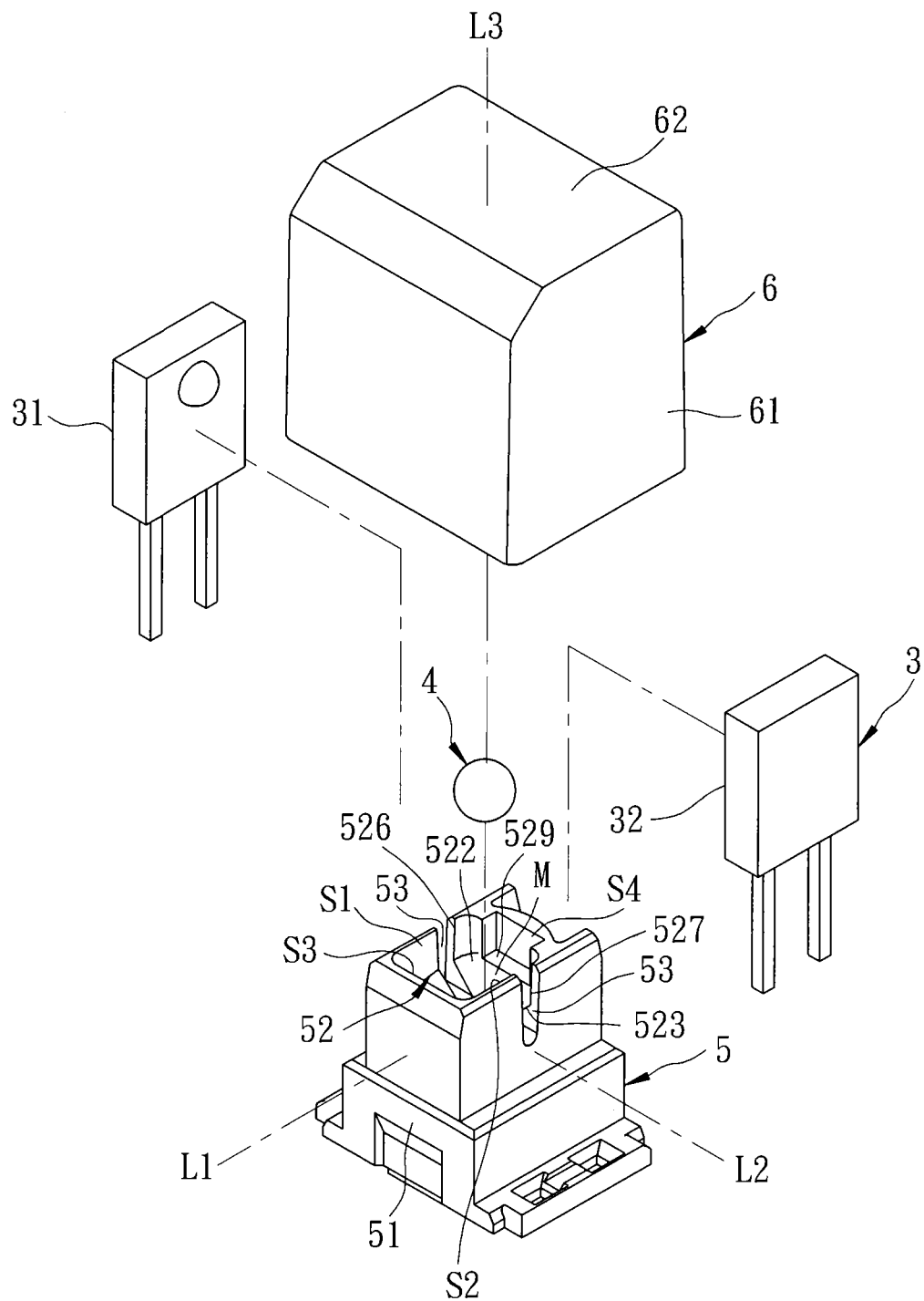
FIG. 3 is an exploded perspective view of a multi-directional sensor switch according to the first preferred embodiment of this invention.
Figure 4:
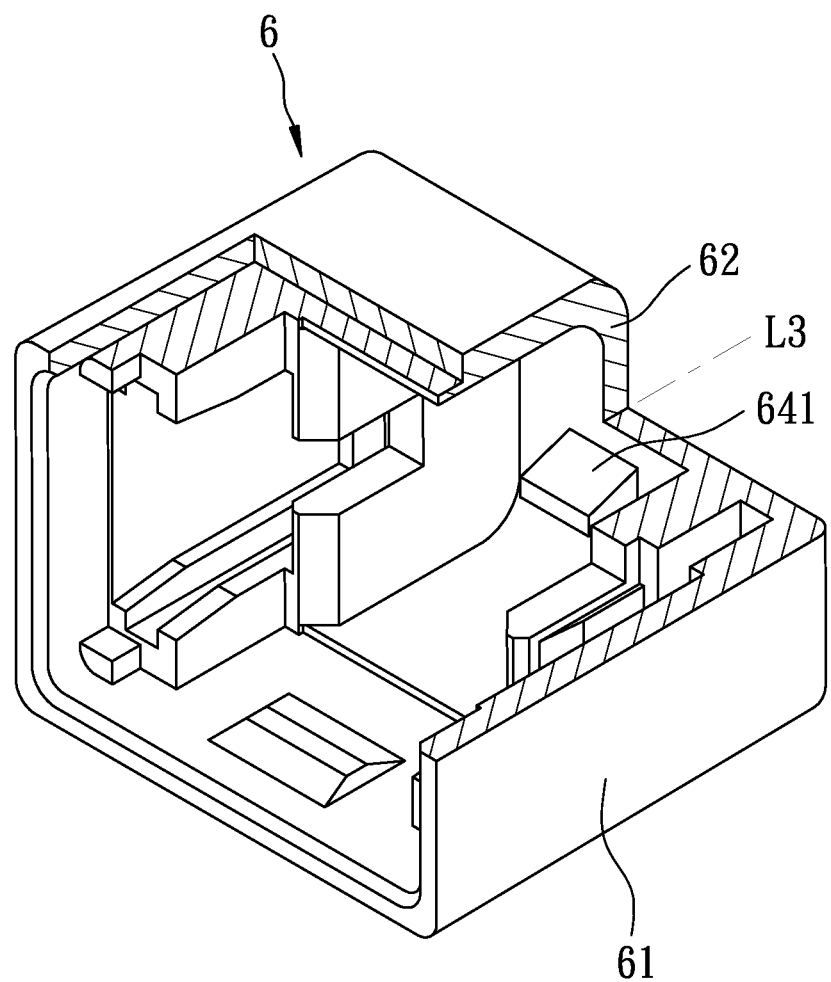
FIG. 4 is a perspective view of a cover body of the first preferred embodiment with a portion thereof removed for clarity's sake.

Before the present invention is described in greater detail, it should be noted that like elements are denoted by the same reference numerals throughout the specification.

Referring to FIGS. 3 to 9, a multi-directional sensor switch according to the first preferred embodiment of this invention comprises a housing, an optoelectronic device 3, and a rolling member 4.

The housing includes a receiving chamber (M) which is defined by a top wall 62, a bottom wall 521, and a multi-sided chamber surrounding wall 52 formed between the top and bottom walls 62, 521. The bottom wall 521 has a bottom inclined wall face 5211 that forms an included angle (θ1) of from −80 degrees to 80 degrees with respect to a first axis (L1). Preferably, the included angle (θ1) ranges from −20 degrees to 20 degrees. In this embodiment, the included angle (θ1) is 10 degrees. The chamber surrounding wall 52 is four-sided, and is formed with two opposite light passage holes 53. The chamber surrounding wall 52 includes first and second sides (S1, S2) that are opposite to each other, and third and fourth sides (S3, S4) which are opposite to each other and which extend upwardly from the bottom wall 521 to the top wall 62 between the first and second sides (S1, S2). The first and second sides (S1, S2) respectively have first and second inclined wall faces 522, 523 extending convergingly toward the bottom wall 521, and first and second non-inclined wall faces 526, 527 extending from the first and second inclined wall faces 5221, 5231 toward the top wall 62. The light passage holes 53 respectively extend through the first and second inclined wall faces 522, 523 and the first and second non-inclined wall faces 526, 527. Further, the light passage holes 53 are proximate to the fourth side (S4), but are distal from the third side (S3).

The first and second inclined wall faces 522, 523 respectively form an included angle (θ2) with respect to a second axis (L2) that is perpendicular to the first axis (L1). The included angle (θ2) ranges from 0 degrees to 80 degrees. Preferably, the included angle (θ1) ranges from 45 degrees to 60 degrees. In this embodiment, the included angle (θ2) is 45 degrees. The second axis (L2) and the first axis (L1) lie on the same plane and are perpendicular to each other. The third side (S3) has a non-inclined wall face 528 connected to the bottom inclined wall face 5211. The fourth side (S4) has a third inclined wall face 641 that is inclined with respect to and that forms an included angle (θ3) with a third axis (L3). The third axis (L3) is perpendicular to the first and second axis (L1, L2). The included angle (θ3) ranges from −80 degrees to 80 degrees. Preferably, the included angle (θ3) ranges from −20 degrees to 20 degrees. In this embodiment, the included angle (θ3) is 20 degrees. The third inclined wall face 641 extends downward from the top wall 62 and is inclined away from the third side (S3). The first and second sides (S1, S2) are substantially parallel to the third axis (L3) except that the first and second inclined wall faces 522, 523 are inclined. The third and fourth sides (S3, S4) are substantially parallel to the third axis (L3) except that the third inclined wall face 641 is inclined.

Particularly, in this embodiment, the housing includes a base seat 5 and a cover body 6. The receiving chamber (M) is defined between the base seat 5 and the cover body 6. The base seat 5 includes a carrier body 51, and has the bottom wall 521 and the first, second, and third sides (S1, S2, S3) supported on the carrier body 51. The cover body 6 has the top wall 62, an outer surrounding wall 62 covering the base seat 5, and the third inclined wall face 641. The fourth side (S4) is defined by the third inclined wall face 641 and an indented wall face 529 on the base seat 5.

The optoelectronic device 3 is mounted in the housing and includes a light emitter 31 and a light receiver 32 disposed outwardly of the chamber surrounding wall 52 at two opposite positions. The light passage holes 53 are aligned respectively with the light emitter 31 and the light receiver 32 to permit a light path (C) (see FIG. 8) from the light emitter 31 to the light receiver 32 to extend therethrough.

The rolling member 4 is disposed in the receiving chamber (M) and is movable between a blocking position and an unblocking position. In the blocking position, the light path (C) is blocked by the rolling member 4, so that a light signal emitted from the light emitter 31 cannot be received by the light receiver 32. In the unblocking position, the rolling member 4 moves away from the light path (C) so that the light signal emitted from the light emitter 31 can be received by the light receiver 32. In this embodiment, the bottom inclined wall face 521 is inclined with respect to a plane extending substantially parallel to and below the light path (C). The first and second axes (L1, L2) both lie on said plane.

Figure 5:
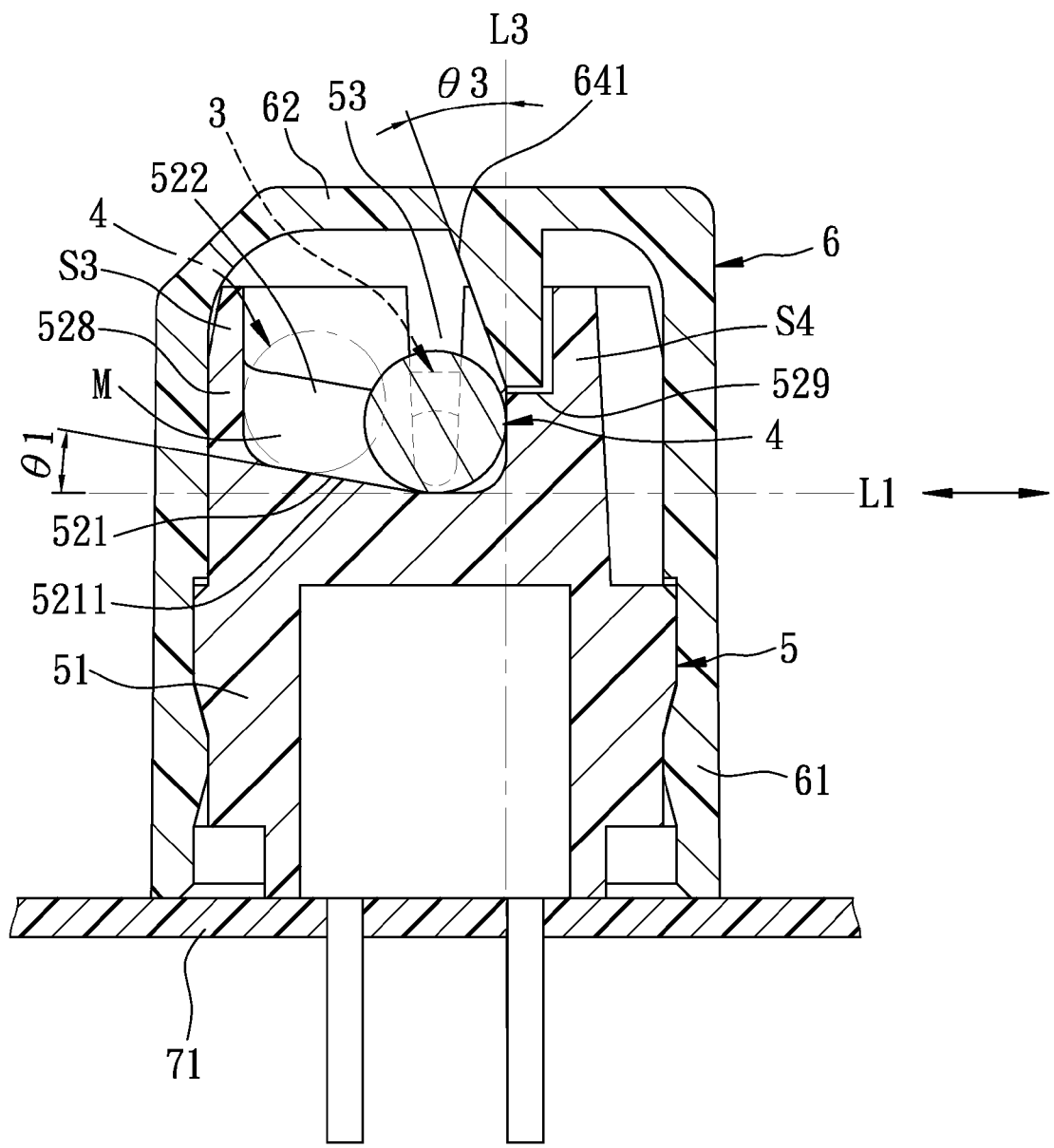
FIG. 5 is a sectional view of the first preferred embodiment in an assembled state.
Figure 7:
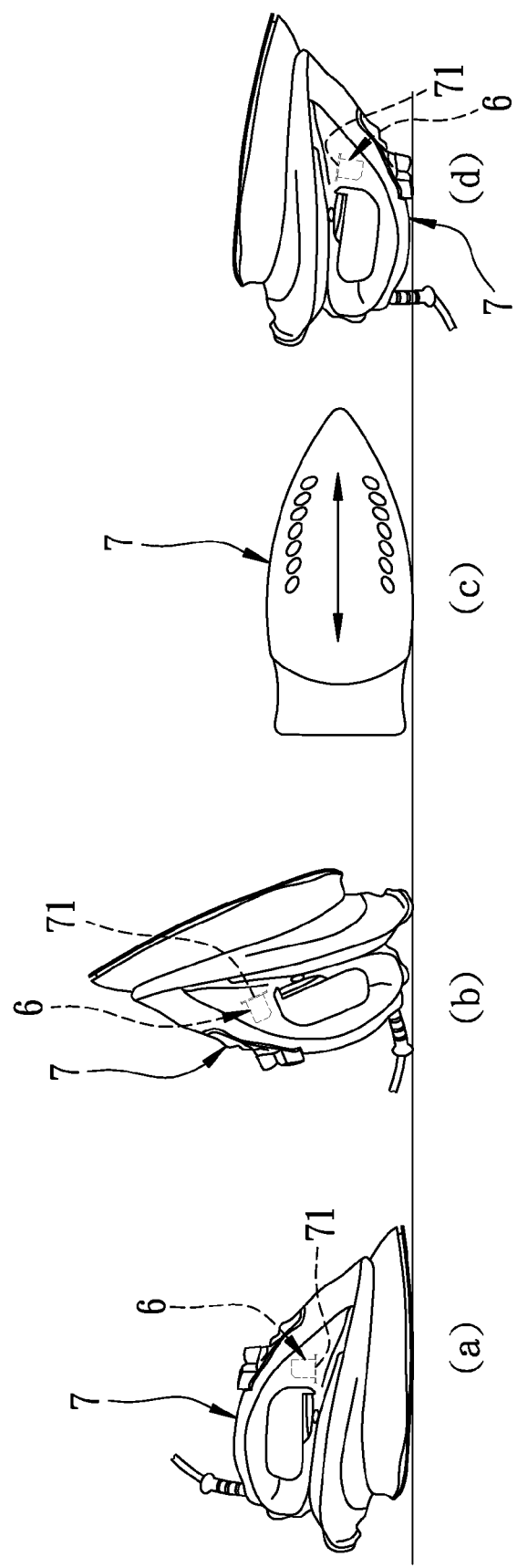
FIG. 7 illustrates an iron incorporating the multi-directional sensor switch of the first preferred embodiment and disposed in different positions.

With reference to FIGS. 5 and 7, when the sensor switch of this invention is installed on a machine plate 71 of an iron 7 in a position as shown in FIG. 5, the rolling member 4 is limited to move inwardly by the first and second inclined faces 522, 523 and the bottom inclined wall face 5211 and downwardly by the third inclined wall face 641, so that the rolling member 4 is disposed in the blocking position. As shown in a state (a) of FIG. 7, when the iron 7 is moved to and fro, the rolling member 4 is moved to roll along the bottom inclined wall face 5211 between the blocking and unblocking positions, so that alternating ON and OFF signals are generated at this state. In this case, the alternating ON and OFF signals can be used as a basis, for example, for the iron 7 to be in a use state. Hence, a first operating mode of the sensor switch may be set.

Figure 6:
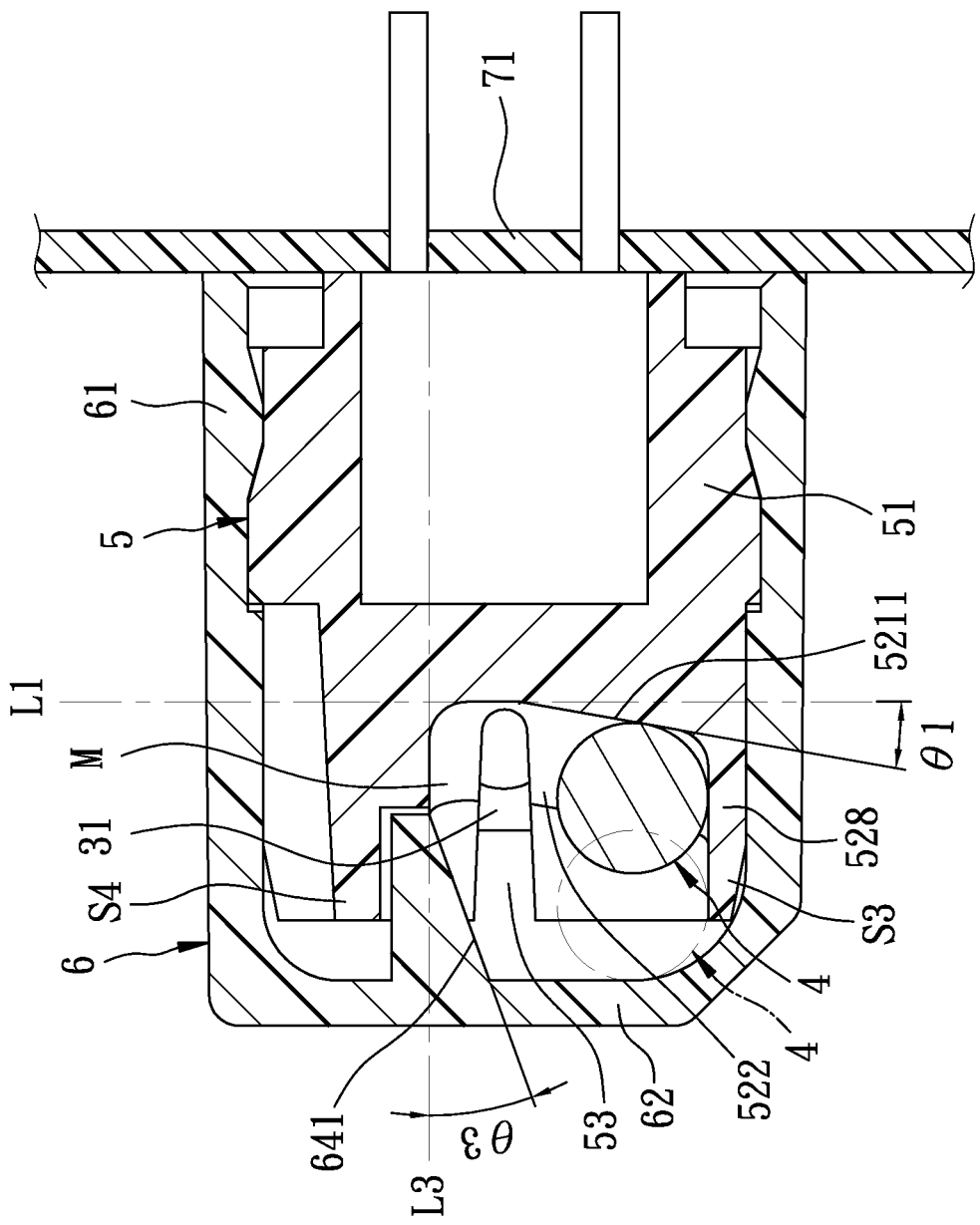
FIG. 6 is a view similar to FIG. 5, but with the first preferred embodiment in another position.
Figure 8:
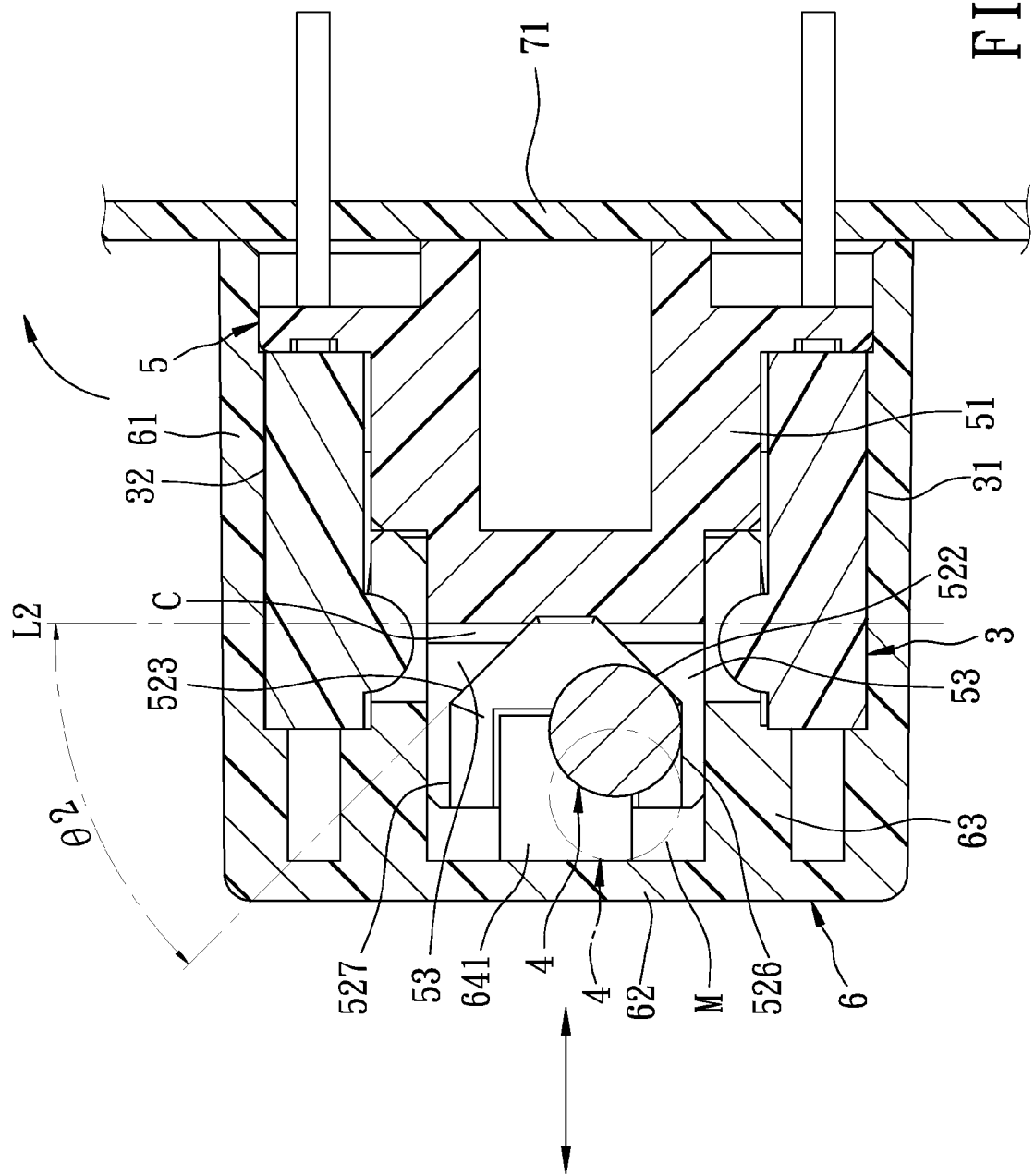
FIG. 8 is another sectional view of the first preferred embodiment, illustrating how a rolling member rolls along an inclined wall face to an unblocking position.

With reference to FIGS. 6 and 7, when the iron 7 is disposed in a state (b) of FIG. 7, the rolling member 4 is rolled from the bottom inclined wall face 5211 to the non-inclined wall face 528 so as to unblock the light path (C) (see FIG. 8). The bottom inclined wall face 5211 prevents the rolling member 4 to roll from the unblocking position back to the blocking position, so that a continuous "ON" signal can be generated. At this time, even if the iron 7 is moved to and fro, no "OFF" signal can be generated. In this case, the continuous "ON" signal can be used as a basis, for example, for the power to be cut-off immediately or at a predetermined time. Hence, a second operating mode of the sensor switch may be set.

With reference to FIGS. 7 and 8, when the iron 7 is disposed in a state (c) of FIG. 7, the rolling member 4 is rolled from the first or second inclined wall face 522, 523 to the first or second non-inclined wall face 526, 527 so as to unblock the light path (C) (see FIG. 8). The first or second inclined wall face 522, 523 prevents the rolling member 4 to roll from the unblocking position back to the blocking position, so that a continuous "ON" signal can be generated. At this time, even if the iron 7 is moved to and fro, no "OFF" signal can be generated. In this case, the continuous "ON" signal can be used as a basis, for example, for the power to be cut-off immediately or at a predetermined time. Hence, a third operating mode of the sensor switch may be set.

Figure 9:
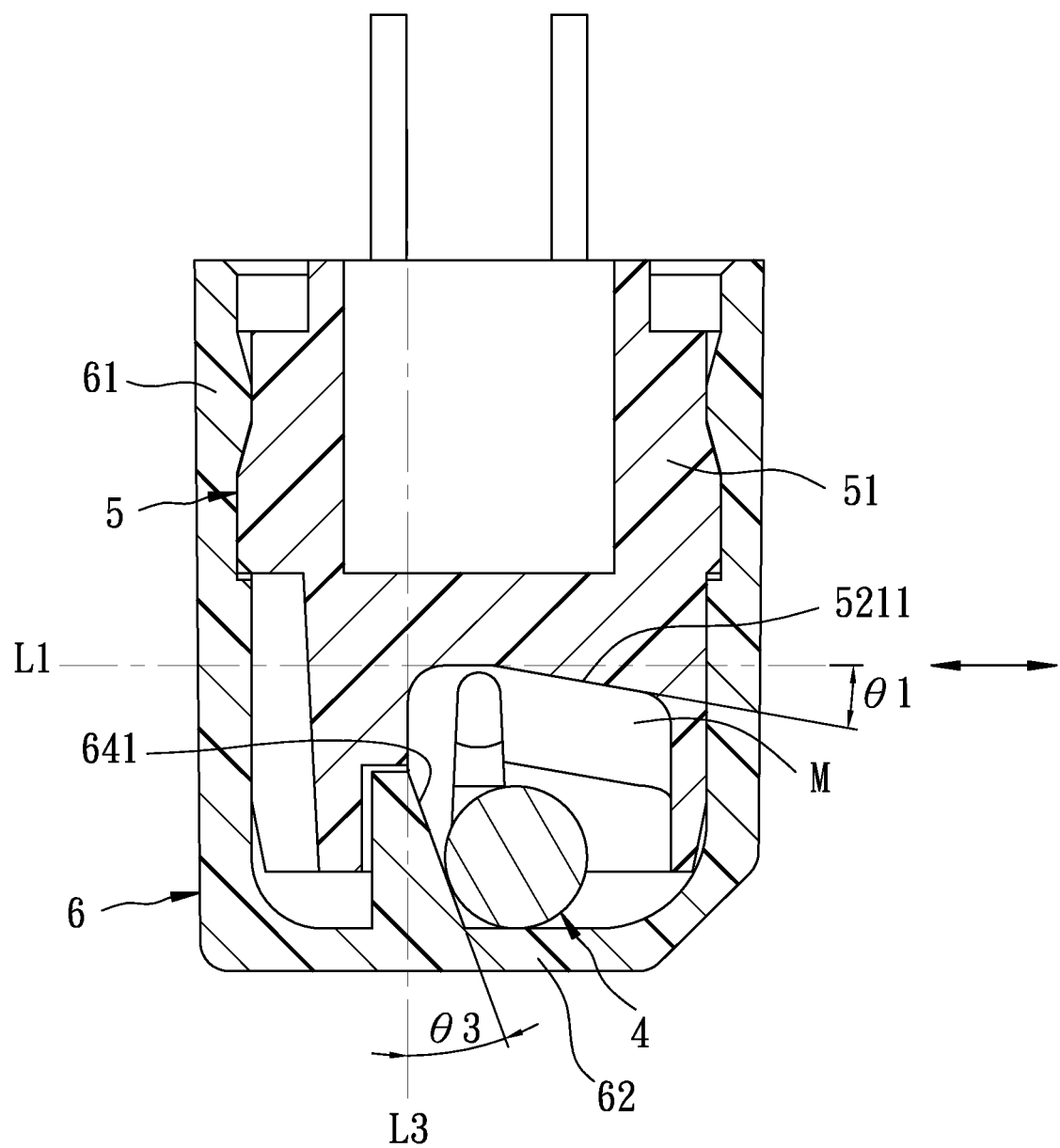
FIG. 9 is a sectional view of the first preferred embodiment, illustrating how the rolling member rolls along another inclined wall face to the unblocking position.

With reference to FIGS. 7 and 9, when the iron 7 is disposed in a state (d) of FIG. 7, the rolling member 4 is rolled from the third inclined wall face 641 to the top wall 62 so as to unblock the light path (C) (see FIG. 8). The third inclined wall face 641 prevents the rolling member 4 to roll from the unblocking position back to the blocking position, so that a continuous "ON" signal can be generated. At this time, even if the iron 7 is moved to and fro, no "OFF" signal can be generated. In this case, the continuous "ON" signal can be used as a basis, for example, for the power to be cut-off immediately or at a predetermined time. Hence, a fourth operating mode of the sensor switch may be set.

Figure 10:
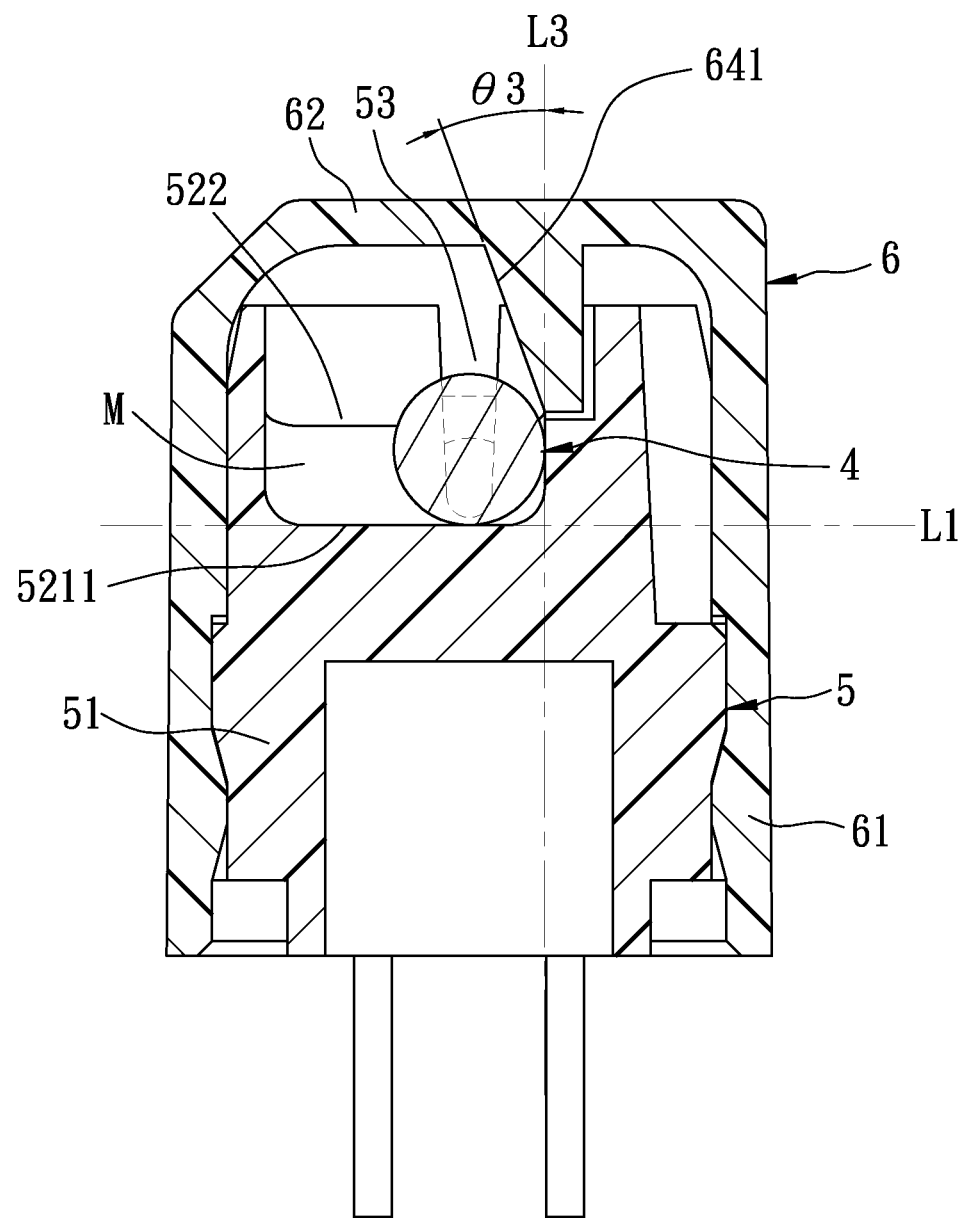
FIG. 10 is a sectional view of a multi-directional sensor switch according to the second preferred embodiment of this invention.

Referring to FIG. 10, the second preferred embodiment of this invention is shown to be similar to the first preferred embodiment. However, in this embodiment, the included angle (θ1) is zero. That is, the bottom inclined wall face 5211 is not inclined with respect to the first axis (L1).

Figure 11:
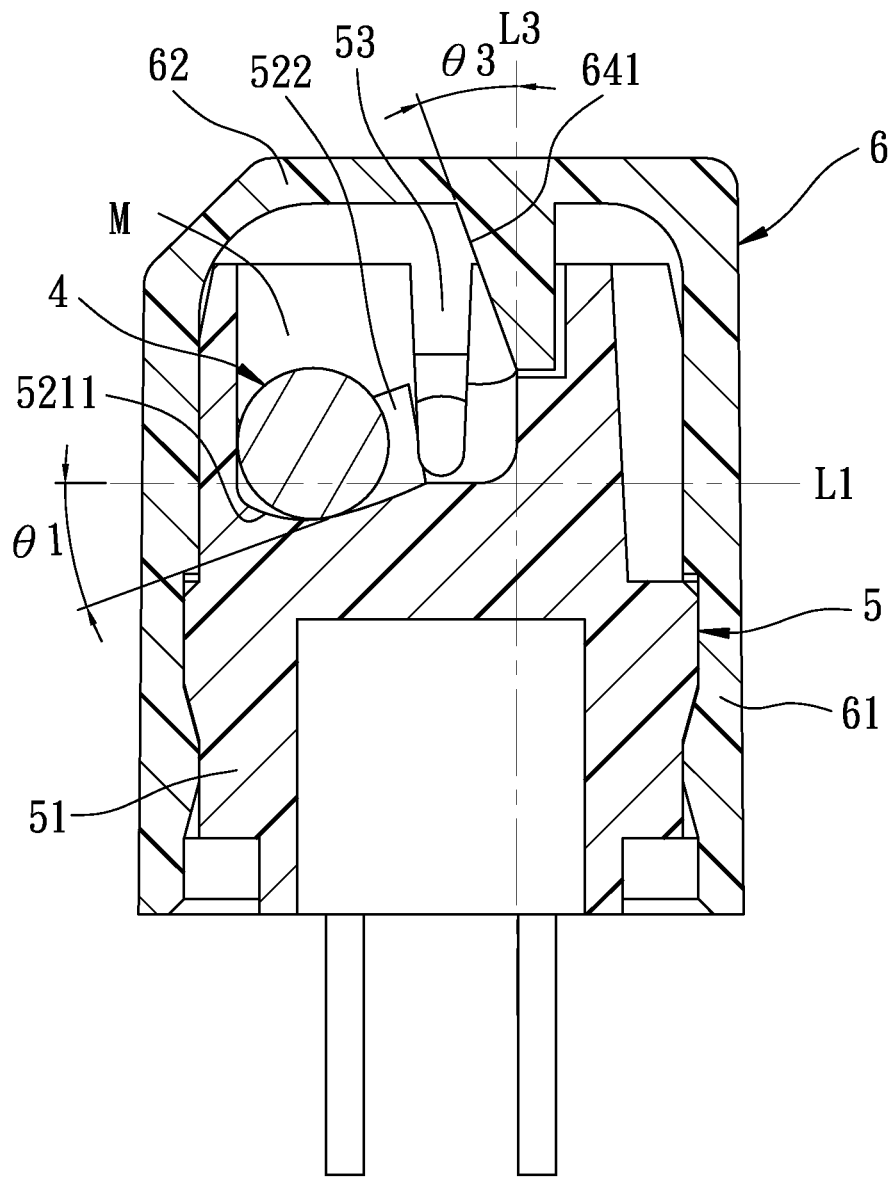
FIG. 11 is a sectional view of a multi-directional sensor switch according to the third preferred embodiment of this invention.

Referring to FIG. 11, the third preferred embodiment of this invention is shown to be similar to the first preferred embodiment. However, in this embodiment, the included angle (θ1) is −20 degrees, and the bottom inclined wall face 5211 is substantially curved.

Figure 12:
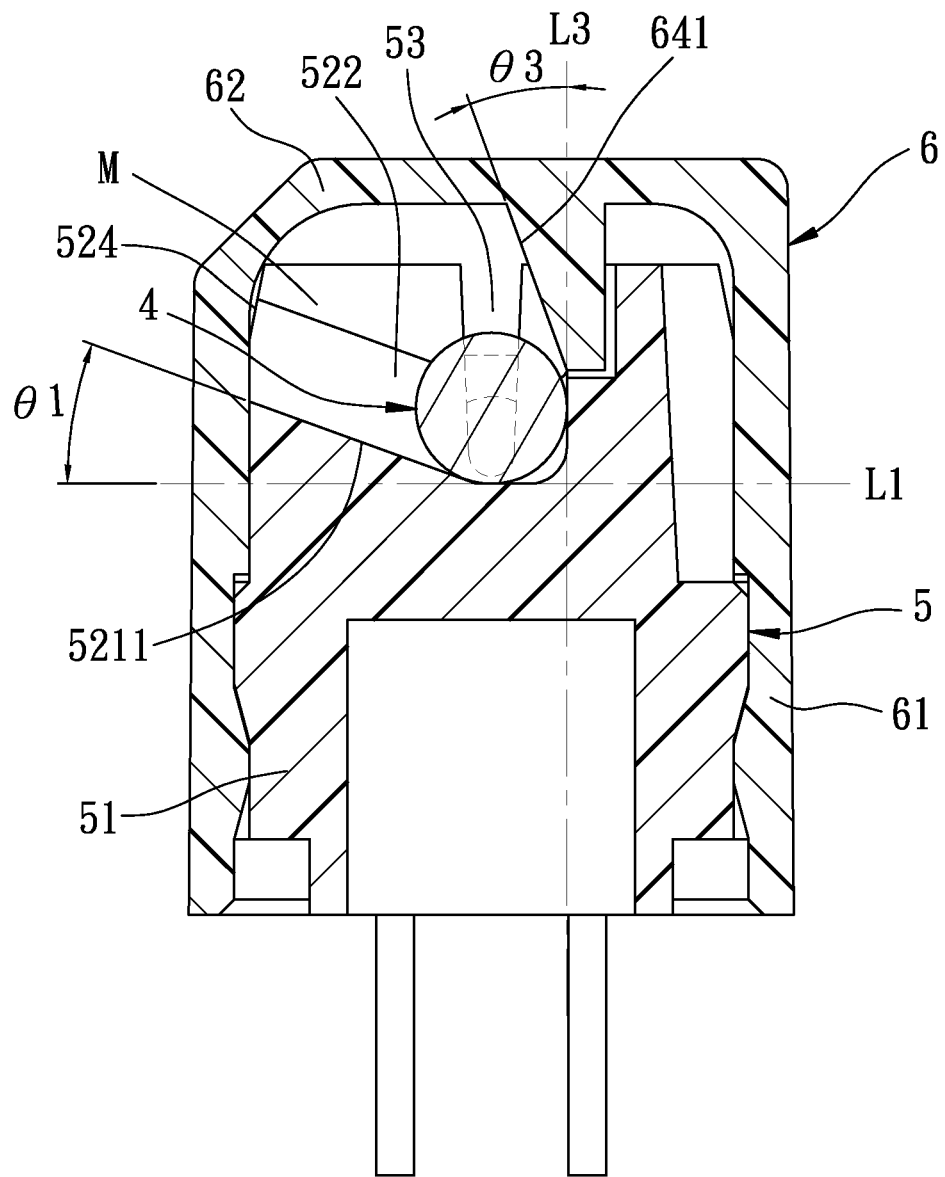
FIG. 12 is a sectional view of a multi-directional sensor switch according to the fourth preferred embodiment of this invention.

Referring to FIG. 12, the fourth preferred embodiment of this invention is shown to be similar to the first preferred embodiment. However, in this embodiment, the included angle (θ1) is 20 degrees, and the base seat 5 further has an opening 524 to facilitate insertion of the rolling member 4 into the receiving chamber (M) during assembly.

Figure 13:
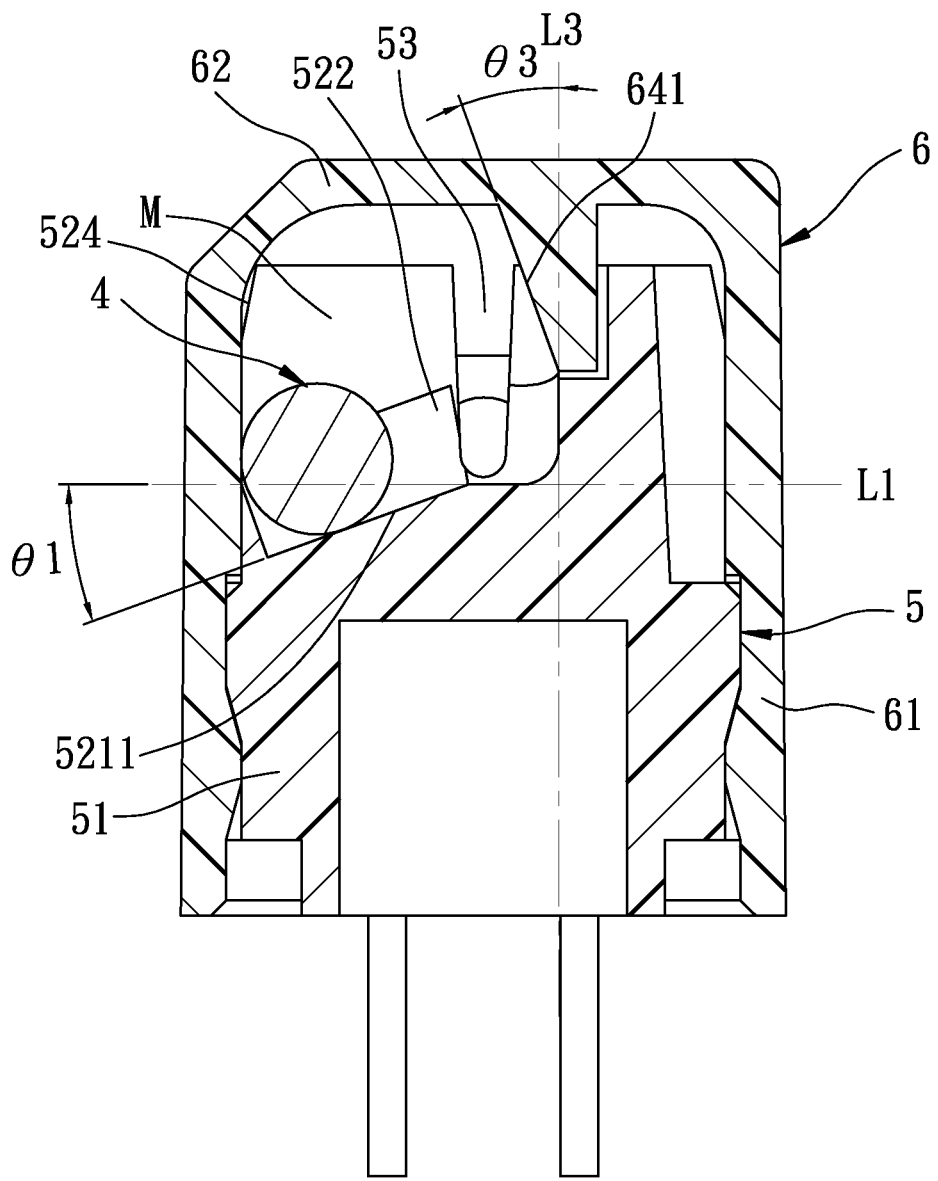
FIG. 13 is a sectional view of a multi-directional sensor switch according to the fifth preferred embodiment of this invention.

Referring to FIG. 13, the fifth preferred embodiment of this invention is shown to be similar to the fourth preferred embodiment. However, in this embodiment, the included angle (θ1) is −20 degrees.

Figure 14:
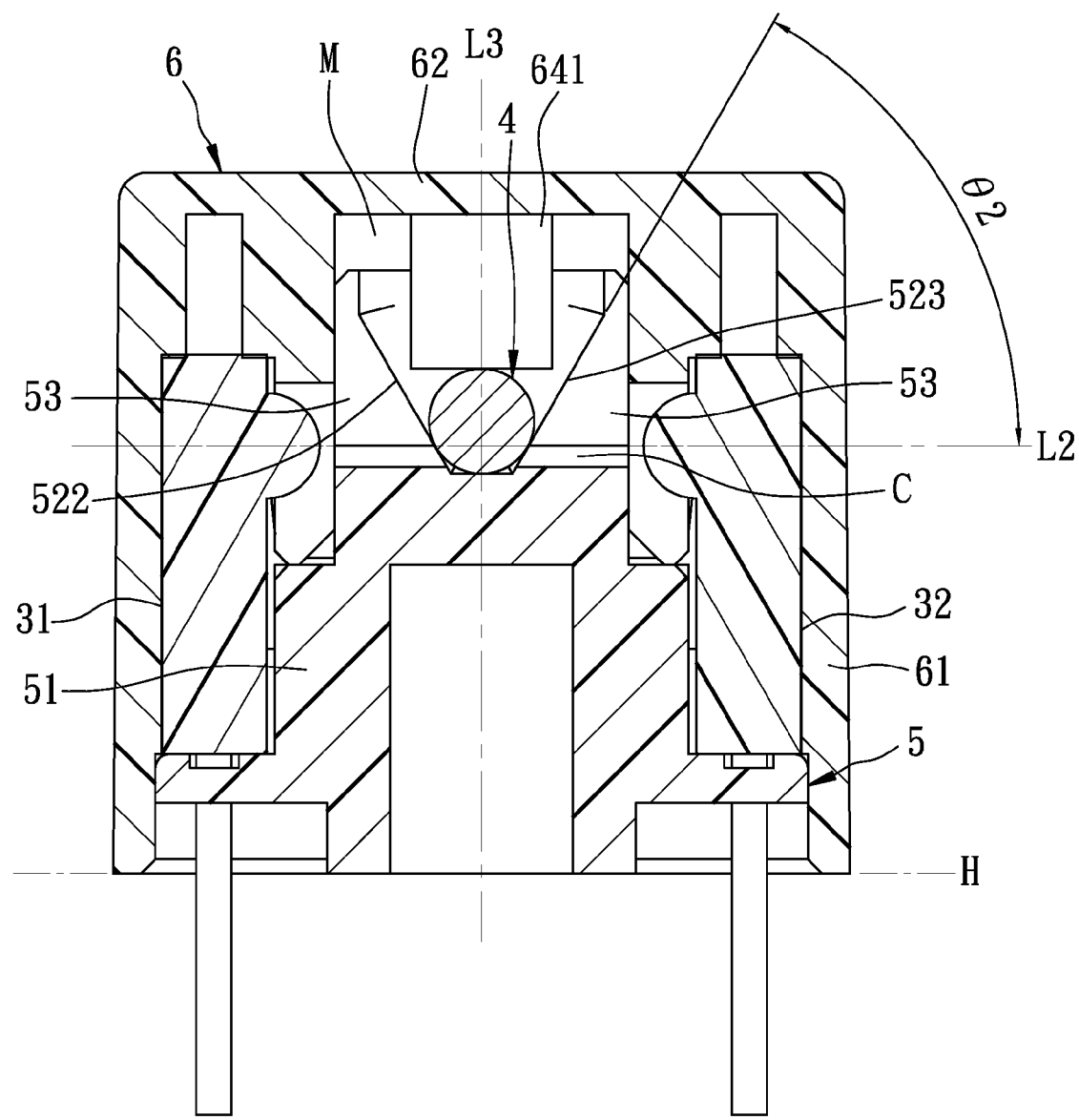
FIG. 14 is a sectional view of a multi-directional sensor switch according to the sixth preferred embodiment of this invention.

Referring to FIG. 14, the sixth preferred embodiment of this invention is shown to be similar to the first preferred embodiment. However, the included angle (θ2) preferably ranges from 45 to 60 degrees. In this embodiment, the included angle (θ2) is 60 degrees.

In summary, the advantage of the multi-directional sensor switch according to this invention resides in that through the configurations of the bottom inclined wall face 521 and the first to third inclined wall faces 522, 523, 641, the rolling member 4 can move along these inclined wall faces 521, 522, 523, 641 between the blocking and unblocking positions so as to generate OFF and ON signals, respectively.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A sensor switch comprising:
   a housing including a receiving chamber which is defined by a top wall, a bottom wall and a multi-sided chamber surrounding wall formed between said top and bottom walls;
   a rolling member disposed rollably in said receiving chamber; and
   an optoelectronic device mounted in said housing and having a light emitter and a light receiver disposed outwardly of said chamber surrounding wall at two opposite positions;
   said chamber surrounding wall being formed with two light passage holes which are aligned respectively with said light emitter and said light receiver to permit a light path from said light emitter to said light receiver to extend therethrough;
   said rolling member being movable in said receiving chamber between a blocking position to block said light path and an unblocking position to unblock said light path;
   said bottom wall having a bottom inclined wall face that is inclined with respect to a plane extending substantially parallel to and below said light path from said light emitter to said light receiver and that forms an included angle of from −80 degrees to 80 degrees with respect to a first axis lying in said plane, said rolling member alternately blocking and unblocking said light path when moving to and fro on said bottom wall; and
   said chamber surrounding wall including first and second included wall faces which extend convergingly toward said bottom wall and which respectively form an included angle with respect to a second axis that extends in said plane and that is perpendicular to said first axis, and third inclined wall face that is inclined with respect to a third axis perpendicular to said first and second axes.

2. The sensor switch as claimed in claim 1, wherein said included angle ranges from −20 degrees to 20 degrees.

3. The sensor switch as claimed in claim 1, wherein said chamber surrounding wall includes first and second sides that are opposite to each other and that respectively have said first and second inclined wall faces, said light passage holes respectively extending through said first and second sides.

4. The sensor switch as claimed in claim 3, wherein said chamber surrounding wall is four-sided and further includes third and fourth sides which are opposite to each other and which extend upwardly from said bottom wall to said top wall between said first and second sides, said fourth side having said third inclined wall face.

5. The sensor switch as claimed in claim 4, wherein said third inclined wall face extends downward from said top wall and is inclined away from said third side.

6. The sensor switch as claimed in claim 5, wherein said light passage holes are proximate to said fourth side and distal from said third side.

7. The sensor switch as claimed in claim 4, wherein said third and fourth sides are substantially parallel to said third axis except that said third inclined wall face is inclined, and said first and second sides are substantially parallel to said third axis except that said first and second inclined wall faces are inclined.

* * * * *